United States Patent

Bendik et al.

[11] Patent Number: 5,027,997
[45] Date of Patent: Jul. 2, 1991

[54] SILICON CHIP METALLIZATION SYSTEM

[75] Inventors: Joseph J. Bendik, Encintas; Stuart C. Billette, Hawthorne, both of Calif.

[73] Assignee: Hughes Aircraft Company, Los Angeles, Calif.

[21] Appl. No.: 505,317

[22] Filed: Apr. 5, 1990

[51] Int. Cl.$^5$ .................... H01L 21/58; B23K 101/40
[52] U.S. Cl. .................................. 228/123; 228/124; 437/190; 357/71
[58] Field of Search ............... 228/122, 123, 124, 208, 228/263.12; 437/190; 357/71

[56] References Cited

U.S. PATENT DOCUMENTS

| | | | |
|---|---|---|---|
| 3,651,562 | 3/1972 | Hambleton | 228/123 |
| 4,023,725 | 5/1977 | Ivett et al. | 228/124 |
| 4,513,905 | 4/1985 | Nowicki et al. | 228/124 |
| 4,772,935 | 9/1988 | Lawler et al. | 228/123 |
| 4,884,123 | 11/1989 | Dixit et al. | 437/190 |

FOREIGN PATENT DOCUMENTS

| | | | |
|---|---|---|---|
| 8202457 | 7/1982 | European Pat. Off. | 228/123 |
| 0279588 | 8/1988 | European Pat. Off. | 437/190 |
| 302538 | 12/1988 | Japan | 437/190 |

Primary Examiner—Sam Heinrich
Attorney, Agent, or Firm—M. E. Lachman; W. J. Streeter; W. K. Denson-Low

[57] ABSTRACT

An improved silicon chip metallization system for use in attaching silicon chips to substrates. The improvement comprises providing a layer of titanium between the silicon chip backside and the layers of chrome and gold which are conventionally used as the backside metallization. The layer of titanium adjacent to the silicon chip backside reduces silicon dioxide formation during chip attachment procedures carried out in non-vacuum environments.

9 Claims, 1 Drawing Sheet

SILICON CHIP METALLIZATION SYSTEM

This invention was made with United States Government support under Contract Number N00030-87-C0073 awarded by the Department of the Navy. The United States Government has certain rights in this invention.

BACKGROUND OF THE INVENTION

1. Field of the Invention

The present invention relates generally to systems and methods for attaching silicon chips to substrates or package bases. More particularly, the present invention involves an improved metallization system for use in such chip attachments.

2. Description of Related Art

The use of eutectic solders, such as gold/tin is a common method for attaching silicon chips to substrates. This technique ensures good heat dissipation and long-term reliability. This attachment procedure involves placing a gold/tin preform between the substrate and a gold layer on the silicon chip and applying heat, to form a gold/tin alloy which functions as a bonding layer between the bottom surface of the silicon chip and the top surface of the substrate. Pure gold melts at temperatures of approximately 1100° C. while pure tin melts at temperatures above 232° C. The 80 percent gold/20 percent tin alloy melts at a temperature of around 280° C. This relatively low melting temperature allows one to attach silicon chips to substrates at temperatures of between 300 to 350° C.

One method for attaching silicon chips to a substrate involves forming a metallization system on the backside of the chip. A metallization system which is presently being used in the industry is shown in FIG. 1. This metallization system includes a layer of chromium and a layer of gold. The layers are typically about 1000 angstroms and 4000 angstroms thick, respectively. The chromium is applied to form an adhesion layer for the gold, while the gold is used primarily to form a mask for the etchants used in the wafer thinning process. During an annealing step at 400° C., the metal layers react and allow a silicon-rich alloy to form on the surface. If oxygen is present in the processing atmosphere, the silicon which reaches the surface is converted into silicon dioxide. The presence of small amounts of silicon dioxide adversely affects chip attachment. As a result, all chip attachment processing utilizing this type of system is typically performed in a vacuum. This technique limits the amount of silicon which oxidizes during any heat treatment and/or during chip attachment.

It would be desirable to provide a metallization system which allows the necessary silicon alloying for chip attachment without the requirement of a vacuum environment. The need for a vacuum environment makes the present chip attachment process time consuming and expensive. Further, it would be desirable to provide a metallization system which could be used in conjunction with a nitrogen belt furnace. Nitrogen belt furnaces are conventional equipment which are designed to be used in processing large numbers of silicon chips.

SUMMARY OF THE INVENTION

The present invention provides an improved metallization system which is designed to allow processing and attachment of silicon chips without the need for a vacuum environment. The invention is based upon the discovery that the placement of a layer of titanium adjacent to the silicon chip backside limits the formation of silicon dioxide during chip processing and attachment under non-vacuum conditions.

The present invention is an improvement to known metallization systems wherein a layer of chrome is located on the silicon chip backside and a layer of gold is located on the layer of chrome. The improvement, in accordance with the present invention, involves placing a layer of titanium between the layer of chrome and the silicon chip backside. The mechanism by which the titanium prevents oxidation of silicon to silicon dioxide is not entirely understood. It is believed that the layer of titanium limits the amount of silicon which can mix with the gold, and also functions as an oxygen scavenger to reduce the amount of oxygen available for reaction with silicon.

As a feature of the present invention, it was discovered that titanium layers of about 1000 angstroms thick provide the desired protection against surface oxidation of silicon while not adversely affecting the chip attachment or other wafer processing procedures. The 1000 angstrom thick titanium layer works well with chrome and gold layers which are approximately 300 angstroms and 4000 angstroms thick, respectively.

As another feature of the present invention, the use of an intermediate titanium layer enables one to perform chip attachments in conventional nitrogen belt furnace systems to thereby increase throughput and yields as compared to conventional vacuum systems.

The above-discussed and many other features and attendant advantages of the present invention will become better understood by reference to the following detailed description when taken in conjunction with the accompanying drawings.

DETAILED DESCRIPTION OF THE PREFERRED EMBODIMENTS

The present invention has wide application to procedures wherein a gold/tin mixture is used as a solder to bond two articles together. The following detailed description will be limited to bonding arrangements wherein the backside of a silicon chip is bonded to a substrate or package base. It will be understood that the principles and teachings of the present invention have wide application to gold attachment methods in general where reaction of silicon with oxygen to form silicon dioxide is a problem.

Figure 1:
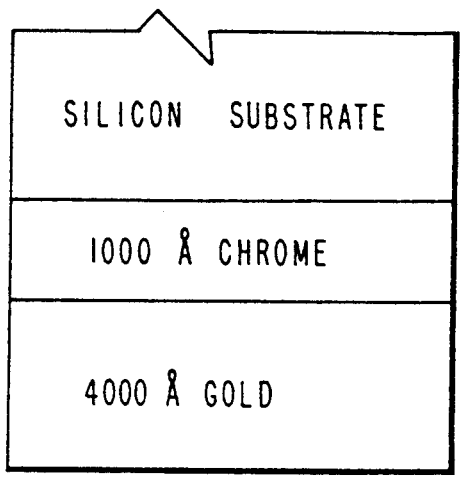
FIG. 1 is a diagrammatic representation of the known silicon backside metallization system wherein a layer of chrome is located on the silicon chip backside and a layer of gold is located on the layer of chrome.

The present invention is an improvement upon existing metallization systems utilized in attaching silicon chips to substrates. A conventional backside metallization system is shown in FIG. 1. The metallization system includes a layer of chrome and a layer of gold placed on the backside of the silicon chip. The chrome and gold layers are applied to the backside of the chip by conventional techniques, e.g. dc sputtering. As shown in FIG. 1, the chrome layer is typically about 1000 angstroms, with the gold layer being about 4000 angstroms thick.

As previously discussed in these conventional systems, the silicon mixes with the chrome and gold layers during heat treatment, forming a eutectic-like mixture. The eutectic-like mixture functions as a solder which serves to attach the chip to the substrate. As also previously mentioned, the silicon exposed on the surface reacts with oxygen to form undesirable silicon dioxide. Accordingly, chip attachments utilizing the metallization system shown in FIG. 1 must be carried out under vacuum conditions.

Figure 2:
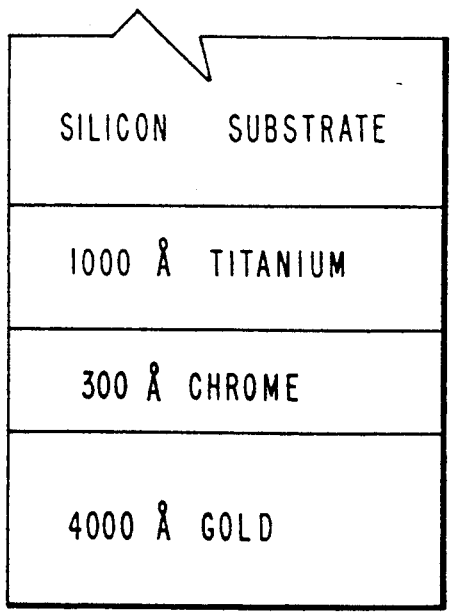
FIG. 2 is a diagrammatic representation of the improved metallization system in accordance with the present invention wherein a layer of titanium is located between the layer of chrome and the silicon chip backside.

In accordance with the present invention, an improved metallization system for attaching the backside of a silicon chip to a substrate is provided wherein a layer of titanium is placed between the silicon chip backside and the layer of chrome. Referring to FIG. 2, a preferred exemplary metallization system in accordance with the present invention is shown diagrammatically. In this preferred embodiment, a layer of titanium is placed between the silicon chip backside and the layers of chrome and gold. It was discovered that the placement of a titanium layer adjacent to the silicon chip backside made it possible to heat treat and attach the silicon chip in non-vacuum conditions while limiting the formation of silicon dioxide.

The layer of titanium is placed on the silicon chip backside by any of the conventionally known methods for applying thin metallic layers, e.g., dc sputtering. The titanium metal layer should be 99.995 percent (i.e., four 9's) pure titanium. It was discovered that a layer of titanium which is about 1000 angstroms thick provided a preferred combination of chip attachment properties while at the same time limiting silicon dioxide formation. In the preferred embodiment, the layer of chrome is reduced in thickness from the standard 1000 angstroms to about 300 angstroms. The reduction in the thickness of the chrome layer when combined with the 1000 angstrom thick titanium layer provides preferred chip attachment characteristics while reducing silicon dioxide formation during processing in a non-vacuum environment such as that found in a nitrogen belt furnace.

The improved preferred exemplary metallization system shown in FIG. 2 is used in accordance with conventional chip attachment processes. The methods and procedures for making and using the preferred exemplary metallization system is the same as the conventional methods and procedures for the prior art metallization system shown in FIG. 1. The only difference being that an approximately 1000 angstrom thick titanium layer is placed adjacent to the silicon, and the conventional 1000 angstrom chrome layer is reduced to a thickness of approximately 300 angstroms.

Examples of practice are as follows. A number of chips were prepared in which the backside of the chip included a 1000 angstrom thick titanium layer, a 300 angstrom thick chrome layer and a 4000 angstrom thick gold layer. The chips were made from unprocessed silicon wafers so that there was no circuitry on the front of the chip nor was there an anti-reflective coating on the back. Both annealed and non-annealed chips were tested. The layers of titanium, chrome and gold were coated onto the backside of the silicon chips according to the following procedure. A three-inch (7.6 cm) silicon wafer was polished using conventional chemical-mechanical polishing techniques. The polished surface was ion etched or dipped in dilute hydrofluoric acid. Then 1000 angstroms of titanium was deposited on the polished surface of the wafer using known dc sputtering techniques. Next, 300 angstroms of chrome and 4000 angstroms of gold were deposited, in turn, using dc sputtering techniques.

The metallized chips were attached to alumina substrates which were plated with a tungsten-based metallization over which nickel and a gold-tin preform were provided.

Samples of annealed metallized chips were sputter profiled by Auger analysis. The annealing procedure involved heating the chips at a temperature of about 400° C. for about 30 minutes. The Auger analysis indicated that all of the metallic elements were present throughout the metallized layer (i.e. gold, silicon, titanium and chrome). This indicates that the titanium does not form a solid barrier which prevents silicon migration to the metal coating surface. Instead, it is believed that the reduction in silicon dioxide formation observed is due to preferential reaction of oxygen with titanium, in combination with a decrease in silicon eutectic formation due to the titanium layer.

A number of metallized silicon chips were attached to substrates in both a vacuum atmosphere and in a conventional nitrogen belt furnace. After chip attachment, the samples were subjected to a simulated cover seal and thermal cycle. This cycle consisted of a 30-minute heat ramp in a nitrogen atmosphere with a maximum temperature of approximately 325° C. being reached. The post-seal thermal cycle consisted of 20 cycles between temperatures of 125° C. and −30° C.

Following the simulated cover seal and thermal cycles, the attached chips were visually examined, photographed and X-rayed. No change in the attachment appearance was observed. The samples were also tested in accordance with Military Standard, Test Methods and Procedures for Microelectronics (MIL-STD-883C), method 2019.2. This test requires that the sample be sheared at twice its minimum gram force. Upon completion of the test there must be at least 90 percent of the die remaining intact, in order to pass. The samples were also microsectioned and inspected visually.

The results of the testing showed that chip attachment utilizing the improved metallization system in accordance with the present invention provided adequate chip attachment regardless of whether the attachment procedure was conducted in vacuum or in a conventional nitrogen belt furnace. The tests demonstrate that the metallization system in accordance with the present invention is an improvement over existing metallization systems since it allows chip attachment to be carried out more quickly, conveniently and less expensively than prior chip attachment procedures which were limited to vacuum environments.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. In a metallization system for attaching the backside of a silicon chip to a substrate, wherein said metallization system includes a layer of chrome located on the silicon chip backside and a layer of gold located on the layer of chrome, the improvement comprising a layer of titanium having a thickness of about 1000 angstroms and being located between the layer of chrome and the silicon chip backside wherein said layer of titanium limit the formation of silicon dioxide on said silicon chip to thereby provide improved attachment of said silicon chip to said substrate.

2. An improved metallization system according to claim 1 wherein the layer of chrome is about 300 angstroms thick.

3. An improved metallization system according to claim 1 wherein the layer of gold is about 4000 angstroms thick.

4. An improved metallization system according to claim 2 wherein the layer of gold is about 4000 angstroms thick.

5. In a method for attaching the backside of a silicon chip to a substrate wherein, prior to attachment, the silicon chip backside is coated with a layer of chrome onto which is coated a layer of gold, the improvement comprising the step of coating the silicon chip backside with a layer of titanium having a thickness of about 1000 angstroms, onto which is coated the layers of chrome and gold, respectively, wherein said layer of titanium limits the formation of silicon dioxide on said silicon chip to thereby improve said attachment of said silicon chip to said substrate.

6. An improved method according to claim 5 wherein the layer of chrome coated onto the layer of titanium is about 300 angstroms thick.

7. An improved method according to claim 5 wherein the layer of gold coated onto the layer of chrome is about 4000 angstroms thick.

8. An improved method according to claim 6 wherein the layer of gold coated onto the layer of chrome is about 4000 angstroms thick.

9. An improved method according to claim 5 including the further step of attaching said silicon chip backside to said substrate.

* * * * *